United States Patent [19]

Kujirai et al.

[11] Patent Number: 5,762,131

[45] Date of Patent: Jun. 9, 1998

[54] HEAT RADIATING BOARD AND METHOD FOR COOLING BY USING THE SAME

[75] Inventors: Yumiko Kujirai; Masami Kujirai; Yukio Kujirai, all of Warabi, Japan

[73] Assignee: Kabushiki Kaisha Sekuto Kagaku, Japan

[21] Appl. No.: 600,977

[22] PCT Filed: Sep. 2, 1994

[86] PCT No.: PCT/JP94/01460

§ 371 Date: Feb. 22, 1996

§ 102(e) Date: Feb. 22, 1996

[87] PCT Pub. No.: WO95/06957

PCT Pub. Date: Mar. 9, 1995

[30] Foreign Application Priority Data

Sep. 3, 1993 [JP] Japan ................. 5-243998

[51] Int. Cl.[6] ............................................ F28F 13/18
[52] U.S. Cl. ................. 165/133; 165/904; 165/DIG. 512
[58] Field of Search ................................... 165/133, 904

[56] References Cited

U.S. PATENT DOCUMENTS

| | | | |
|---|---|---|---|
| 2,750,654 | 6/1956 | Owens | 165/80.3 X |
| 2,965,819 | 12/1960 | Rosenbaum | 165/80.3 X |
| 3,640,832 | 2/1972 | Kurz | 161/164 |
| 4,132,916 | 1/1979 | Hueschen et al. | 313/330 |
| 4,293,785 | 10/1981 | Jackson, Jr. | 310/64 |
| 4,928,027 | 5/1990 | Deininger et al. | 310/11 |
| 4,942,732 | 7/1990 | Priceman | 60/261 |
| 5,056,126 | 10/1991 | Klostermann et al. | 378/127 |
| 5,241,836 | 9/1993 | Bly | 62/467 |

FOREIGN PATENT DOCUMENTS

| | | | |
|---|---|---|---|
| 1138525 | 6/1957 | France . | |
| 2033461 | 12/1970 | France . | |
| 2353787 | 12/1977 | France . | |
| 2510589 | 9/1976 | Germany | 165/909 |
| 57-29162 | 2/1982 | Japan . | |
| 1-296094 | 11/1989 | Japan | 165/133 |
| 4-230063 | 8/1992 | Japan . | |
| 4-365362 | 12/1992 | Japan . | |
| 60391 | 1/1939 | Norway | 165/904 |

*Primary Examiner*—Allen J. Flanigan
*Attorney, Agent, or Firm*—Wenderoth, Lind & Ponack

[57] ABSTRACT

A heat radiating board and a method for cooling by utilizing the same based on a novel principle of heat gradient. The heat radiating board, which is disposed between a high temperature zone and a low temperature zone, consists of a metal plate and a heat gradient-forming layer laminated on the surface thereof facing the low temperature zone, this heat gradient-forming layer being formed from a heat conductive material having a heat volume and an absorption of heat of radiation smaller than the metal plate.

9 Claims, 3 Drawing Sheets

$T_H > T_L$ $T_H > T_L$ 5,762,131

HEAT RADIATING BOARD AND METHOD FOR COOLING BY USING THE SAME

TECHNICAL FIELD

The present invention relates to a heat radiating board based on a novel principle, capable of dissipating heat with high efficiency from a zone which is brought to a high temperature by the generation of heat during use, including electric appliances such as television sets, computers and motors, engines and radiators of automobiles, various kinds of machine manufacturing apparatuses and the like to a zone at a low temperature as well as to a cooling method by utilizing the same.

BACKGROUND ART

Known methods for decreasing the temperature of a high temperature zone by dissipating the heat from the high temperature zone to a low temperature zone include the methods in which the low temperature zone side is cooled with air or water through a metal plate having good heat conductivity or, namely, the air cooling method and water cooling method.

In order to enhance the cooling efficiency of the metal plate, the surface facing the low temperature zone is ruggedly shaped or the surface is provided with a large number of fins or heat radiating auxiliary bodies to increase the contact area with the cooling medium (Japanese Utility Model Kokai No. 62-52770), and a film of water is formed on the surface to promote cooling by utilizing the heat of vaporization thereof (Japanese Patent Publication No. 6-3335), etc.

However, shaping of the surface to impart ruggedness or providing fins or heat radiating auxiliary bodies on the surface have defects in that a special working process is required and, in addition, cleaning works when stains are troublesome and it is not applicable to a part where smoothness of the surface is required, while the method utilizing the heat of vaporization is not free from limitations in the applicable ranges because a special apparatus is required for the formation of a film of water on the metal surface.

DISCLOSURE OF INVENTION

The present invention has been completed with an object to provide a heat radiating board based on a completely novel principle, having a simple structure and still exhibiting a high efficiency of heat radiation by overcoming the defects in a heat radiating board heretofore used in the air cooling method or water cooling method.

The inventors have conducted investigations on the mechanism for cooling of a high temperature zone through a heat radiating board disposed between the high temperature zone and a low temperature zone and, as a result, obtained the information which follows.

More specifically, when heat is transferred by radiation or convention to the surface of a heat radiating board facing a high temperature zone, the heat on the surface facing the high temperature zone is transferred to the surface facing the low temperature zone in the mode of conduction. Being contacted with a cooling fluid at the surface facing the low temperature zone, the heat is transferred to the cooling fluid. The temperature decrease of the heat radiating board in contact with the cooling fluid takes place more rapidly as the total heat volume of the material constituting the heat radiating board is decreased.

When a layer having a small total heat volume is provided on the surface of the heat radiating body facing the low temperature zone, an equilibrium is maintained in this layer between the heat transferred from the heat radiating body and the heat removed by the cooling fluid so that, assuming that the heat removed by convection is identical, the temperature of the surface facing the low temperature zone is decreased more as compared with the case of the heat radiating board alone, resulting in promotion of heat transfer taking place through the heat radiating board from the surface facing the high temperature zone.

Following is a numerical equation expressing the state of this heat flow.

$$q = \alpha_1(T_r - T_1)$$
$$= \lambda/L(T_1 - T_2)$$
$$= \alpha_0(T_2 - T_0)$$

Where, q is the heat flow, $\alpha_1$ is the heat transfer coefficient of the fluid in the high temperature zone, $\alpha_0$ is the heat transfer coefficient of the fluid in the low temperature zone, $T_r$ is the temperature of the fluid in the high temperature zone, $T_1$ is the temperature of the surface of the heat radiating board facing the high temperature zone, $T_2$ is the temperature of the surface of the heat radiating board facing the low temperature zone, $T_0$ is the temperature of the fluid facing the low temperature zone, $\lambda$ is the heat conductivity of the heat radiating board and L is the thickness of the heat radiating board.

As is shown by this equation, heat flows from the fluid in the high temperature zone to the surface of the heat radiating board facing the high temperature side, flows through the inside of the heat radiating board by conduction and flows from the surface of the heat radiating board facing the low temperature zone to the fluid in the low temperature zone.

On the other hand, a body is subjected to transfer of heat by the incidence of sunlight, far infrared light generated secondarily and the like so that it is necessary to also study the influence of these heats of radiation. Incidentally, when a partition wall disposed between a high temperature zone and a low temperature zone receives the heat of radiation, the partition wall absorbs the heat of radiation so that the temperature of the whole body is increased. And, while the surface facing the low temperature zone is kept at the low temperature due to perpetual contact with the fluid at the low temperature, the temperature of the inside thereof such as the portion in the vicinity of the center in the direction of thickness is kept in a somewhat elevated state so that the temperature is increased insofar as the absorption of heat of radiation is continued arriving at the same temperature as or at a higher temperature than the temperature at the high temperature zone side, leading to a result that the flow of heat from the surface facing the high temperature zone to the surface facing the low temperature zone is inhibited. This trend is more remarkable in a body having large absorption of the heat of radiation than in a body having small absorption of heat of radiation.

Accordingly, even when a layer having a smaller total heat volume than the heat radiating board is provided to the low temperature zone side of the heat radiating board, the absorption of heat of radiation as a whole is increased much if the absorption of heat of radiation by this layer is larger than in the heat radiating board as such, so that the flow of heat from the surface facing the high temperature zone to the surface facing the low temperature zone is rather inhibited.

Based on the above mentioned discovery, the inventors have conducted extensive investigations and, as a result, arrived at a finding that, when a heat radiating board is formed by laminating, on one surface of a metal plate, a thin layer consisting of a material having a smaller heat volume and also a smaller absorption of heat of radiation than the metal plate to be disposed with the same facing the low temperature zone, the effect of heat dissipation can be greatly enhanced as compared with a heat radiating board consisting of the metal plate alone, leading to completion of the present invention.

Thus, the present invention provides a heat radiating board which is characterized in that, in a heat radiating board mainly consisting of a metal plate for the purpose of heat dissipation from a high temperature zone to a low temperature zone by being disposed between the high temperature zone and the low temperature zone, a heat gradient-forming layer consisting of a heat conductive material having a smaller heat volume and absorption of heat of radiation than the said metal plate onto the surface of the said metal plate facing the low temperature zone as well as a cooling method characterized in that the heat radiating board is disposed between a high temperature zone and a low temperature zone with the metal surface facing the high temperature zone and also with the surface of the heat radiating board facing the low temperature zone under contacting with a cooling fluid.

The heat volume, when expressed by Q, is a parameter defined by the following equation.

$$Q = V \cdot d \cdot C$$
$$= W \cdot C$$

Therein, C is the specific heat or, namely, the quantity of heat required to increase the temperature of the substance per unit weight (g) by 1° C. (cal/g/°C.), d is the density or, namely, the weight (g) per unit volume ($cm^3$) of the substance, V is the total volume of the substance ($cm^3$) and W is the total weight of the substance. The above mentioned specific heat c is inherent in each material and the numerical value thereof to be used in the present invention is, though varied depending on the temperature, the value obtained by the measurement using a conventional instrument for the measurement of specific heat at a temperature of the outer atmosphere.

The absorptivity of heat of radiation is the proportion of the radiant temperature of the radiation from a heat source to the decrease in the temperature after the radiation passes through a specified material expressed in percentage and the absorptivity of heat of radiation X in a specified material can be obtained according to the following equation.

$$X=(T-T')/T \times 100$$

Therein, T is the radiant temperature (°C.) of the radiation from the heat source and T' is the radiant temperature (°C.) of the radiation from the heat source after passing through the specified material.

BEST MODE FOR CARRYING OUT THE INVENTION

Figure 1:
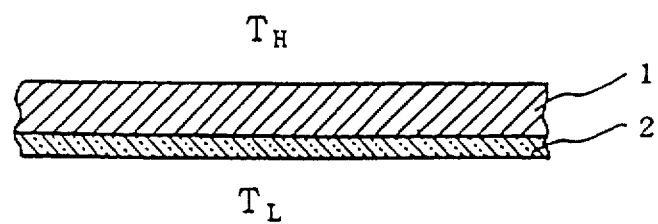
FIG. 1 is an enlarged cross sectional view illustrating an example of the structure of the heat radiating board of the present invention.

Particular embodiments of the present invention are described in detail by making reference to the accompanying drawing. FIG. 1 is an enlarged cross sectional view illustrating an example of the structure of the heat radiating board of the present invention, in which a heat gradient-forming layer 2 is laminated on one surface of the metal plate 1. And, the metal plate 1 is disposed to face a high temperature zone at a temperature $T_H$ and the heat gradient-forming layer 2 is disposed to face a low temperature zone at a temperature $T_L$. The material of this metal plate can be selected freely from metals and alloys heretofore known as a material for heat radiating boards.

They are exemplified by simple metals such as, for example, iron, aluminum, copper, nickel, platinum, silver, gold, tungsten, zinc and the like and alloys such as stainless steels, brass, bronze, chromium-nickel alloys, aluminum-silicon alloys, aluminum-manganese alloys, nickel-copper alloys, titanium-iron alloys, titanium-aluminum alloys and the like. The metal plate of the present invention can optionally be provided with a protective film further thereon by plating, vapor deposition and the like or can be subjected to a surface working such as an oxidation treatment and the like in so far as the principal constituent is one of these metals and alloys.

The metal plate usually has a thickness in the range from 0.5 to 10 mm but the thickness can be larger when it is to be used in a large-size application such as large boilers and can be smaller in the case of a compact application.

The shape of this metal plate is not particularly limitative and can be shaped in any desired form such as squares, circles, tubes, semispheres, spheres and the like and can be worked to have a surface form such as a wavy form, rugged surface, protruded surface and the like.

Usable materials for the heat gradient-forming layer to be laminated onto one surface of these metal plates include any material exhibiting a lower absorption of radiation than the surface of the metal plate. Plastics are particularly satisfactory in respect of the convenience for the adjustment of the heat volume and absorption of heat of radiation and ease of the laminating work onto the metal plate. Examples of such a plastic include high-pressure polyethylene, low-pressure polyethylene, ethylene-vinyl acetate copolymers, ethylene-acrylic acid or -acrylic acid ester copolymers, metal-containing ethylene-acrylic acid copolymers, ethylene-propylene copolymers, ethylene-vinyl chloride-vinyl acetate copolymers, polypropylene, propylene-vinyl chloride copolymers, polyvinyl chloride, polyvinyl-idene chloride, polystyrene, polyethylene terephthalate, ABS resins, polyamide, polyacetal, fluorocarbon resins, acrylic resins, methacrylic resins, polycarbonate, urea resins, melamine resins, unsaturated polyesters, silicone resins, epoxy resins and the like. These plastics can optionally be compounded with various kinds of conventional additives and it is possible to adjust the heat volume and absorptivity of heat of radiation by modifying the kinds, combinations and amounts of these additives. They can be used either singly or as a blend of two or more.

The method for the lamination of a metal plate and a heat gradient-forming layer in the present invention can be freely selected as desired from the methods conventionally undertaken heretofore for lamination on a metal plate with a different material including a method in which the same is shaped in advance in the form of a sheet or film which is applied and bonded to the surface of the metal plate by heat-welding or adhesive bonding, a method in which the plastic is dissolved in a suitable solvent and applied to or sprayed at the metal plate followed by drying and solidification and so on.

In this manner, a heat gradient-forming transparent layer having a thickness of 1 to 1000 μm or, preferably, 10 to 500 μm is laminated onto the metal plate.

It is essential that these heat gradient-forming layers have heat conductivity in order not to disturb the heat flow from the surface of the heat radiating board facing the high temperature zone to the surface facing the low temperature zone. Accordingly, it is not preferable to use a material having a heat insulating effect or a material such as, for example, foamed styrenes and foamed urethanes.

In the present invention, it is essential that the heat gradient-forming layer has a heat volume and an absorption of heat of radiation smaller than those of the metal plate and, in particular, it is advantageous that the heat volume does not exceed 10% or, preferably, does not exceed 5% and the absorption of heat of radiation does not exceed 60% or, preferably, does not exceed 50% of those of the metal plate.

FIG. 1 illustrates an example where the heat gradient-forming layer is a unitary layer but, in the present invention, it is optional to provide a plurality of layers for this heat gradient-forming layer. In this case, it is essential that the heat gradient-forming layer directly laminated on the metal plate has a heat volume and absorption of heat of radiation smaller than that of the metal plate and, moreover, in the heat gradient-forming layer facing the metal plate and in the heat gradient-forming layer on the reverse side thereto, the heat volume and absorption of heat of radiation of the latter should be smaller than that of the former. Moreover, it is desirable, i.e., that the outermost heat gradient-forming layer that forming the surface to facing the low temperature zone have a heat volume not exceeding 10% or, preferably, not exceeding 5% of the heat volume of the metal plate and an absorption of heat of radiation not exceeding 60% or, preferably, not exceeding 50% of the absorption of heat of radiation of the metal plate.

The lower limit of the heat volume of the heat gradient-forming layer in the present invention is not particularly limitative and a sufficient effect can be noted even with a proportion as small as 0.01%. As to the absorption of heat of radiation, it is natural that a good result can be obtained as it is decreased with improved smoothness of the heat flow.

When cooling of a high temperature zone is conducted by using this heat radiating board, all or a part of the partition walls of the high temperature zone is formed from this heat radiating board with the metal plate facing inwardly and heat dissipation is performed by passing a cooling fluid such as, for example, air or water over the surface facing the low temperature zone to remove the heat on the surface. With an object to promote heat dissipation, in this case, it is optional to concurrently employ conventional methods such as a method in which the contact area with the cooling fluid is increased by forming a rugged surface or by providing fins, a method in which removal of heat is promoted by blowing air over the surface, or a method in which a water film is formed on the surface to promote cooling by the heat of vaporization thereof.

In this way, it can be satisfactorily utilized for prevention of overheating of atomic reactors and power generators, prevention of overheating of automobile radiators, improvement of the efficiency of refrigerators, improvement of the heat-exchange efficiency in heat exchangers, dissipation of the heat generated inside of a television set, etc.

In the following, the present invention is described in further detail by way of examples.

REFERENCE EXAMPLE

Three square iron plates each 50 cm by 50 cm wide and 1 mm thick (heat volume 216.4 cal/°C. and absorptivity of heat of radiation 98%) were prepared and each of them was laminated on one side as divided into halves in the transverse direction with a polyvinyl chloride in a varied thickness of 113 µm, 68 µm or 18 µm, respectively, to provide a heat gradient-forming layer having a heat volume of 5.0%, 3.0% and 0.8%, respectively, relative to the heat volume of the iron plate.

Figure 2:
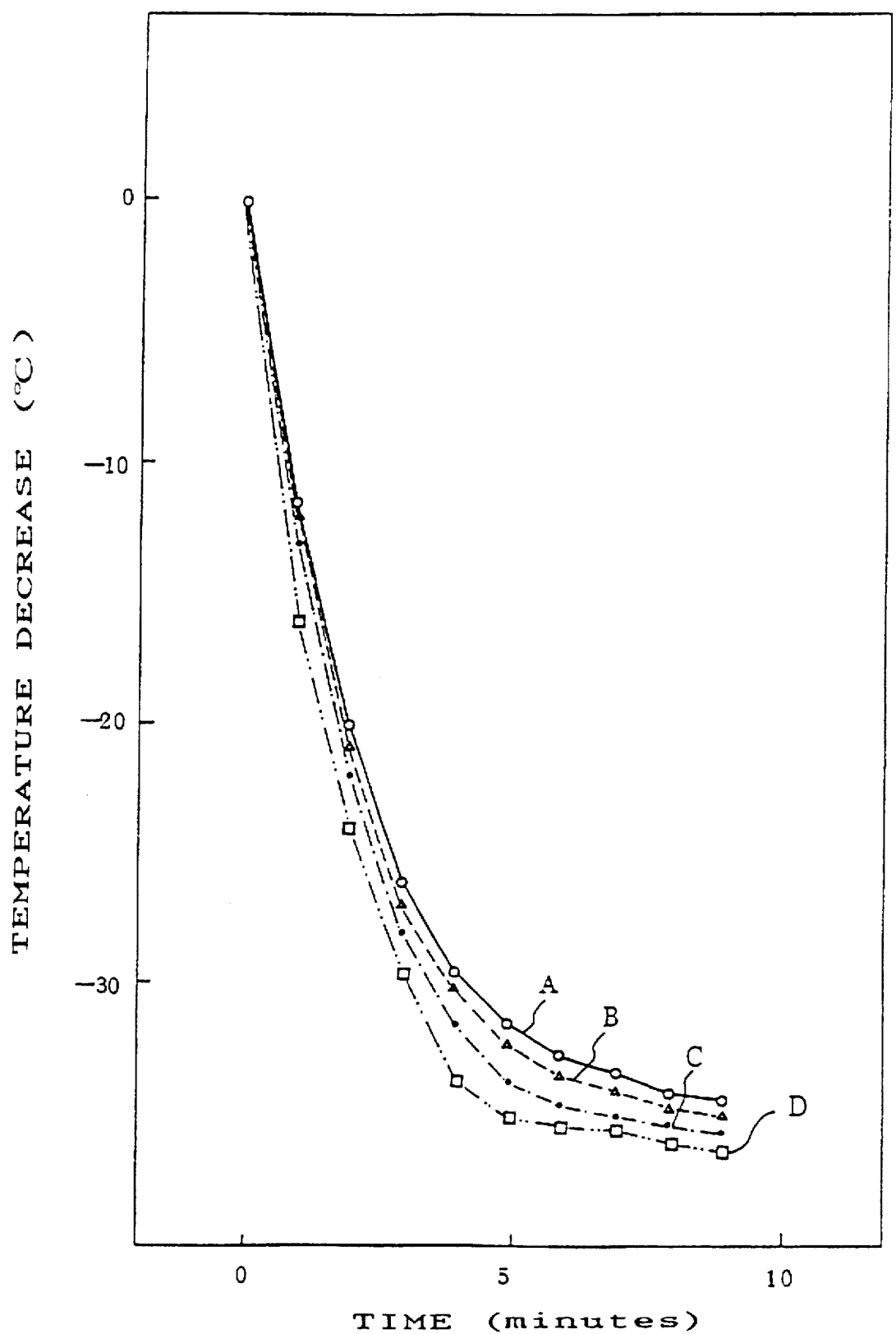
FIG. 2 is a graph showing the function of the heat gradient-forming layer in Reference Example of the present invention.

In the next place, uniform irradiation was performed with an infrared lamp on the surface opposite to the surface provided with this heat gradient-forming layer to heat up to 60° C. followed by interruption of the irradiation to determine the changes in the lapse of time in the decreasing temperature on the respective surfaces. The results are shown in FIG. 2. A in this figure is for the iron plate only while B is for the lamination with polyvinyl chloride in a thickness of 113 µm, C is for the thickness of 68 µm and D is for the thickness of 18 µm.

It is understood from this FIG. 2 that dissipation of heat was promoted by providing the heat gradient-forming layer.

EXAMPLE 1

Two cubic boxes (50×50×50 cm) having a single open side surface were prepared from foamed styrene boards of 5 mm thickness and a heat radiating board (A) consisting of a single iron plate of 1 mm thickness alone (heat volume 216.4 cal/°C. and absorptivity of heat of radiation 98%) was mounted onto the open side of one of the boxes and another heat radiating board (B) prepared by forming a coating film of 5 µm thickness of a methyl methacrylate-ethyl acrylate-styrene copolymer (heat volume 0.5 cal/°C. and absorptivity of heat of radiation 1.9%) on the outside surface of the iron plate was mounted on the open side of the other box.

Next, these boxes were heated simultaneously from outside to increase the inside temperature up to 63° C. followed by setting an air conditioner at a position about 1.2 meters apart from the heat radiating board to conduct cooling by blowing of cooled air at 16° C. at the heat radiating board. The inside temperature of the boxes there was measured with lapse of time and the results are shown in FIG. 3 by the plot of the broken line (A) and the solid line (B).

Figure 3:
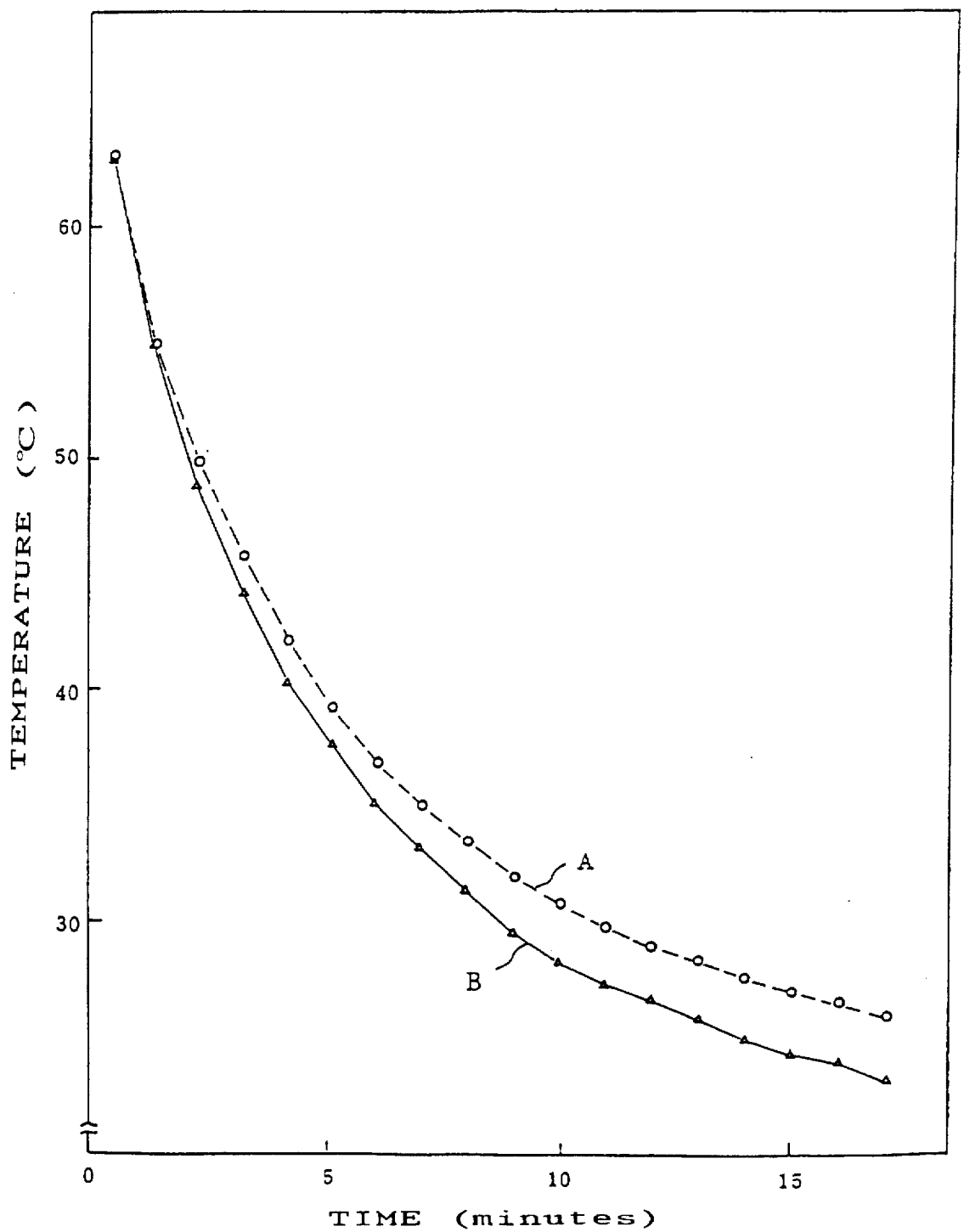
FIG. 3 is a graph showing the effect of heat dissipation in Example 1 of the present invention.

It is understood from this FIG. 3 that cooling was promoted by providing the heat gradient-forming layer on the iron plate.

EXAMPLE 2

Two of the same boxes made of foamed styrene as in Example 1 were prepared and a heat radiating board consisting of a zinc-plated commercially available iron plate having a thickness of 1 mm (heat volume 216.4 cal/°C. and absorptivity of heat of radiation 95%) alone was mounted on the open side of one of the boxes while a heat radiating board of this iron plate provided with a coating film of a methyl methacrylate-ethyl acrylate-styrene copolymer having a different thickness on the outside surface was mounted on the open side of the other box.

Next, these boxes were placed within a room at a temperature of 20° C. and each of them was simultaneously heated from inside with a 125 watts infrared lamp covered with a black cloth to measure the change of the inside temperature in the lapse of time. The results are shown in Table 1.

TABLE 1

| Sample No. | Thickness of coating film (μm) | $X_2/X_1 \times 100$ | initial | after 1 minute | after 2 minutes | after 3 minutes | after 4 minutes | after 5 minutes | after 10 minutes | after 30 minutes | after 60 minutes | after 90 minutes |
| --- | --- | --- | --- | --- | --- | --- | --- | --- | --- | --- | --- | --- |
| | | | | | | Inside temperature (°C.) | | | | | | |
| 1 | 5 | 0.23 | 20 | 24 | 27.5 | 31.5 | 37.5 | 44 | 68.5 | 68 | 68.5 | 68 |
| 2 | 10 | 0.46 | 20 | 24 | 27.5 | 32 | 38 | 44 | 68 | 68.5 | 68.5 | 68.5 |
| 3 | 50 | 2.3 | 20 | 24.5 | 27.5 | 31.5 | 38.5 | 44.5 | 68.5 | 69 | 69.5 | 69 |
| 4 | 100 | 4.6 | 20 | 24 | 28 | 32 | 39 | 44.5 | 69 | 70 | 71 | 72 |
| 5 | 150 | 6.9 | 20 | 24.5 | 28.5 | 32.5 | 39.5 | 45 | 70 | 72 | 72 | 72.5 |
| 6 | 200 | 9.2 | 20 | 24.5 | 28.5 | 33 | 40 | 46 | 71 | 73 | 73 | 74 |
| 7 | 220 | 10.1 | 20 | 25 | 29.5 | 34.5 | 42 | 47.5 | 73 | 75 | 75 | 76 |
| 8 | None | — | 20 | 25 | 30.5 | 36.5 | 43.5 | 50 | 75.5 | 76.5 | 76.5 | 77 |

Note) In the table, $X_1$ is the heat volume of the iron plate and $X_2$ is the heat volume of the coating film.

It is understood from this table that the effect of heat dissipation was improved by the use of a heat radiating board provided with a heat gradient-forming layer and that those having a heat gradient-forming layer having a heat volume not exceeding 10% of the heat volume relative to the iron plate exhibited a particularly excellent effect of heat dissipation.

EXAMPLE 3

A heat radiating board was prepared by laminating a 0.5 mm thick layer of a blend of a methyl methacrylate-ethyl acrylate-styrene copolymer and a silicone oil (heat volume 0.5 cal/°C. and absorptivity of heat of radiation 1.9%) on a commercially available iron plate of 1 mm thickness (heat volume 126.4 cal/°C. and absorptivity of heat of radiation 98%). This heat radiating board was spread over and mounted on the wholly open side of a foamed styrene-made box (50×50×50 cm) with the iron plate facing inwardly and exposed to sunlight by disposing outdoors to measure the change in the inside temperature.

And, the same box with the iron plate alone spread over and mounted on the wholly open side was placed side by side for comparison and the change in the inside temperature hereof was measured. The results are shown in Table 2.

TABLE 2

| Sample No. | Kind of heat radiating board | Initial | after 2 minutes | after 4 minutes | after 6 minutes | after 8 minutes | after 10 minutes | after 12 minutes |
| --- | --- | --- | --- | --- | --- | --- | --- | --- |
| | | | Inside temperature (°C.) | | | | | |
| 1 | with lamination | 36 | 41.7 | 42.5 | 43.5 | 43.0 | 43.6 | 43.5 |

TABLE 2-continued

| Sample No. | Kind of heat radiating board | Initial | after 2 minutes | after 4 minutes | after 6 minutes | after 8 minutes | after 10 minutes | after 12 minutes |
| --- | --- | --- | --- | --- | --- | --- | --- | --- |
| | | | Inside temperature (°C.) | | | | | |
| 2 | without lamination | 36 | 42.6 | 45.0 | 45.5 | 45.0 | 45.5 | 45.6 |

It is understood from this table that the effect of heat dissipation could be improved by the use of a heat radiating board provided with a heat gradient-forming layer even under heating from outside.

EXAMPLE 4

In rooms of the same volume with openings (windows) of the same size on the 8th floor of an eleven-storied ferroconcrete building, an iron plate having a 5 μm thick coating of a copolymer of ethyl acrylate, methyl methacrylate and styrene on a commercially available zinc-plated iron plate of 1 mm thickness (heat volume 216.4 cal/°C. and absorptivity of heat of radiation 95%) was mounted on the opening of one of the rooms with this coated surface facing the outer atmosphere. Another iron plate without coating was mounted on the opening of the other room.

During a night (i.e., without incidence of sunlight), the changes of the temperature with lapse of time within the rooms when warming was performed with a hot-air room warmer having a capacity of 2300 kcal/hour are shown.

There, the volume of the rooms was 17.25 m³ for each room and the area of the opening was 1.40 m².

The proportion of the heat volume of the coating film there was about 0.23% relative to the iron plate.

The results are shown in Table 3.

TABLE 3

| Time | | 18 o'clock | 19 o'clock | 20 o'clock | 21 o'clock | 22 o'clock | 23 o'clock | 24 o'clock |
| --- | --- | --- | --- | --- | --- | --- | --- | --- |
| Temperature (°C.) | Outdoor | 10.2 | 10.1 | 9.9 | 9.8 | 8.6 | 8.3 | 8.1 |
| | with coating film | 17.6 | 19.6 | 20.4 | 20.8 | 21.2 | 21.5 | 21.5 |

TABLE 3-continued

| Time | 18 o'clock | 19 o'clock | 20 o'clock | 21 o'clock | 22 o'clock | 23 o'clock | 24 o'clock |
|---|---|---|---|---|---|---|---|
| without coating film | 17.3 | 18.9 | 19.3 | 19.7 | 19.9 | 19.9 | 20.1 |

It is understood from this table that the iron plate provided with a heat gradient-forming layer exhibited a larger effect of heat dissipation.

INDUSTRIAL APPLICABILITY

The present invention is a heat radiating board utilizing a novel principle of heat radiation and the efficiency of a heat radiating board can be improved by merely undertaking the very simple step of lamination for the formation of a heat gradient so that it can be utilized in wide range of fields such as capacity increase of coolers, heat exchangers and the like, prevention of overheating of instruments accompanied by internal heat generation and so on.

We claim:

1. In a heat radiating board mainly composed of a metal plate for heat dissipation from a high temperature zone to a low temperature zone by being disposed between the high temperature zone and the low temperature zone, improvement wherein the said metal plate is laminated on the surface facing the low temperature zone with a heat gradient-forming layer consisting of a heat conductive material having a heat volume and an absorption of heat of radiation smaller than the said metal plate.

2. The heat radiating board described in claim 1 in which the heat volume and the absorption of heat of radiation of the heat gradient-forming layer do not exceed 10% of the heat volume and 60% of the absorption of heat of radiation of the metal plate.

3. A method for cooling wherein a heat radiating board mainly consisting of a metal plate laminated on one surface with a heat gradient-forming layer consisting of a heat conductive material and having a heat volume and absorption of heat of radiation smaller than the said metal plate is installed between a high temperature zone and a low temperature zone with the surface of the metal facing the high temperature zone, the surface of the said heat radiating board facing the low temperature zone being in contact with a cooling fluid, to effect dissipation of heat.

4. The method for cooling described in claim 3 in which each of the heat volume and the absorption of heat of radiation of the heat gradient-forming layer does not exceed 10% of the heat volume and 60% of the absorption of heat of radiation, respectively, of the metal plate, respectively.

5. The method for cooling described in claim 3 in which the cooling fluid is cooling air or cooling water.

6. The heat radiating board described in claim 1 wherein the metal plate is subjected to an oxidation treatment prior to lamination.

7. The method for cooling according to claim 3 wherein the metal plate is subjected to oxidation treatment prior to lamination.

8. The heat radiating board according to claim 1, wherein said metal plate is an iron plate, and said heat conductive material having a heat volume and absorption of heat of radiation smaller than said metal plate is a methyl methacrylate-ethyl acrylate-styrene copolymer.

9. The method as claimed in claim 3, wherein the metal plate is an iron plate and the heat conductive material having a heat volume and absorption of heat radiation smaller than said metal plate is a methyl methacrylate-ethyl acrylate-styrene copolymer.

* * * * *